United States Patent [19]
Matsuzaki et al.

[11] Patent Number: 5,264,730
[45] Date of Patent: Nov. 23, 1993

[54] RESIN MOLD PACKAGE STRUCTURE OF INTEGRATED CIRCUIT

[75] Inventors: Toshio Matsuzaki, Yokohama; Hiroaki Toshima, Hachioji; Nobuo Hirasawa, Kawasaki, all of Japan

[73] Assignee: Fujitsu Limited, Kawasaki, Japan

[21] Appl. No.: 944,033

[22] Filed: Sep. 11, 1992

Related U.S. Application Data

[63] Continuation of Ser. No. 636,151, Dec. 31, 1990, abandoned.

[30] Foreign Application Priority Data

Jan. 6, 1990 [JP] Japan .................................. 2-801

[51] Int. Cl.⁵ ............................................. H01L 23/48
[52] U.S. Cl. .................................. 257/787; 257/676; 257/783; 257/666
[58] Field of Search ............... 357/70, 72, 80, 68, 357/81; 257/787, 676, 783, 666

[56] References Cited

U.S. PATENT DOCUMENTS

| | | | |
|---|---|---|---|
| 4,546,028 | 10/1985 | Val | 428/116 |
| 4,797,726 | 1/1989 | Manabe | 357/70 |
| 4,816,427 | 3/1989 | Dennis | 437/209 |
| 4,862,246 | 8/1989 | Masuda et al. | 357/72 |
| 4,884,124 | 11/1989 | Mori et al. | 357/72 |
| 4,918,511 | 4/1990 | Brown | 357/70 |
| 4,942,454 | 7/1990 | Mori et al. | 357/72 |
| 4,994,895 | 2/1991 | Matsuzaki et al. | 357/72 |

FOREIGN PATENT DOCUMENTS

| | | |
|---|---|---|
| 52-95173 | 12/1977 | Japan . |
| 53-13874 | 7/1978 | Japan . |
| 55-103752 | 8/1980 | Japan . |
| 56-76542 | 9/1981 | Japan . |
| 57-39558 | 3/1982 | Japan . |
| 58-18948 | 2/1983 | Japan . |
| 59-88857 | 5/1984 | Japan . |
| 61-99360 | 5/1986 | Japan . |
| 61-102054 | 5/1986 | Japan . |
| 61-184854 | 1/1987 | Japan . |
| 62-263665 | 11/1987 | Japan . |
| 63-44749 | 7/1988 | Japan . |
| 63-81966 | 8/1988 | Japan . |
| 1-154545 | 9/1989 | Japan . |
| 1-179439 | 10/1989 | Japan . |
| 2-40938 | 4/1990 | Japan . |
| 2-125651 | 5/1990 | Japan . |

OTHER PUBLICATIONS

Patent Abstracts of Japan, vol. 10, No. 158 (E-409) (2214), 6 Jun. 1986, and JP-A-61 014731 (Kansai Nippon Denki) 22 Jan. 1986.
Patent Abstracts of Japan, vol. 10, No. 309 (E-447) (2365) 21 Oct. 1986, and JP-A-61 123162 (Toshiba Corp) 11 Jun. 1986.
Patent Abstracts of Japan, vol. 6, No. 136 (E-120) (1014) 23 Jul. 1982, and JP-A-57 060860 (Nippon Denki) 13 Apr. 1982.
Patent Abstracts of Japan, vol. 10, No. 175 (E-413) (2231) 20 Jun. 1986, and JP-A-61 024253 (Hitachi Seisakusho) 1 Feb. 1986.
Patent Abstracts of Japan, vol. 9, No. 263 (E-351) (1986) 19 Oct. 1985, and JA-A-60 (Oki Denki Kogyo) 14 Jun. 1985.
Patent Abstracts of Japan, vol. 12, No. 54 (E-583) (2901) 18 Feb. 1988, and JP-A-62 200751 (Dainippon Printing Co) 4 Sep. 1987.

*Primary Examiner*—Eugene R. LaRoche
*Assistant Examiner*—Viet Q. Nguyen
*Attorney, Agent, or Firm*—Staas & Halsey

[57] ABSTRACT

A hybrid integrated circuit is provided having a substrate with at least one active and passive element disposed thereon. A lead frame has a plurality of leads and a support plate. The support plate supports the substrate. The support plate and inner leads are encapsulated in a resin mold package. An opening is formed in the support plate to thermally connect the bottom surface of the substrate to the resin mold package, and a plurality of devoid portions are formed in the substrate causing the amount of edge area contacting the resin mold package to be increased and adhesion between the substrate and the resin mold package improved.

23 Claims, 5 Drawing Sheets

RESIN MOLD PACKAGE STRUCTURE OF INTEGRATED CIRCUIT

This application is a continuation of application Ser. No. 07/636,151, filed Dec. 31, 1990, now abandoned.

BACKGROUND OF THE INVENTION

1. Field of the Invention

The present invention relates to an electronic part packaged in a resin mold package; and more particularly, to a structure of a hybrid integrated circuit substrate with a lead frame supporting the circuit substrate. The hybrid integrated circuit substrate of the present invention has a comparatively large size and comprises a substrate and a plurality of active and passive elements disposed thereon, wherein the hybrid integrated circuit substrate and a part of the lead frame are encapsulated by the resin mold package.

2. Description of the Related Art

In recent years, resin mold packages have become popular for packaging of semiconductor integrated circuits and hybrid integrated circuits. In a resin mold package, a semiconductor integrated circuit chip or a ceramic substrate, having active and passive elements thereon, is insert-molded with a lead frame. Hybrid integrated circuits have become popular to provide higher integration circuits. The higher the integration of a hybrid integrated circuit, the larger the dimensions become of the circuit substrate and the resin mold package. Higher integration circuits have problems such as cracking of the resin mold package during storage and operation due to the differences in expansion coefficients and adhesion characteristics of, for example, the resin mold package, lead frame and ceramic substrate. This problem will be briefly explained with reference to FIGS. 7(a) and 7(b).

FIGS. 7(a) and 7(b) show a prior art hybrid integrated circuit structure. FIG. 7(a) is a top view without the resin mold package, and FIG. 7(b) is a cross section thereof with the resin mold package included. A lead frame 2 comprises an outer lead 24a, an inner lead 24b, a tie-bar 23, a support-bar 22, and a support plate 20. The support plate 20 has a square or rectangular shape and is supported by four of the support-bars 22 at each corner of the square/rectangular shape. A ceramic substrate 1 is supported on the support plate 20 of the lead frame 2. As shown in FIG. 7(b), a semiconductor integrated circuit chip 11, a capacitor 12, and a resistor (not shown) are disposed or formed on the substrate 1. These active and passive elements are connected to each other and/or to a bonding pad and/or to a conductive wiring pattern formed on the substrate 1 by a bonding wire. The bonding wires and wiring pattern are not shown in the FIG. 7(a). The bonding pads are further connected to the terminals of the inner leads 24b by a bonding wire 5 as shown in FIG. 7(b). Thereafter, the assembly is subjected to a transfer-mold process to form a mold package 6, such as shown in FIG. 7(b). The outer leads 24a are then shaped and the unnecessary portions of the lead frame 2 are cut off to complete the hybrid integrated circuit.

When the hybrid integrated circuit disclosed above is subjected to a number of heat cycles during operation, a crack 8 such as shown in FIG. 7(b) often arises in the resin mold package. The crack usually originates at the corner of the substrate 1 or the support plate 20. To solve the problem of cracks being formed, several references on package structures were disclosed in U.S. application Ser. No. 375,708, filed Jul. 5, 1989, now U.S. Pat. No. 4,994,985 issued Feb. 19, 1991. These references are U.S. Pat. No. 4,816,427 and Japanese Publications SHO 63-81966, 52-95173, 57-39558, 61-99360, 61-102054, 62-263665, 55-103752, 53-13874, and 58-18948. Most of these references relate to package structures for semiconductor integrated circuit chips which have a smaller size than a hybrid integrated circuit substrate. None of these references disclose methods for forming holes or notched portions in the peripheral zone of a support plate or for forming a hole in the central zone thereof.

SUMMARY OF THE INVENTION

It is an object of the present invention provide a hybrid integrated circuit having a resin mold package which can withstand wide temperature changes during operation.

It is a further object of the present invention to provide a hybrid integrated circuit in which adhesion between a resin mold package and a ceramic substrate is stronger than before possible.

It is another object of the present invention to provide a hybrid integrated circuit with a higher reliability for repeated heat cycles during operation.

It is still another object of the present invention to provide a hybrid integrated circuit having a resin mold package with stronger resistance to gas released from moisture absorbed in the mold during storage.

The above and other objects and features are achieved by a hybrid integrated circuit, comprising a lead frame including a plurality of leads and a support plate, the support plate supporting the substrate and each lead having an inner lead and an outer lead, a substrate having a plurality of devoid portions formed therein and mounted on the support plate, at least one active element and passive element disposed on the substrate, and a resin mold encapsulating the substrate, the support plate and the inner leads. According to the present invention, the plurality of devoid portions are formed in the substrate causing the amount of substrate edge area contacting the mold to be increased and adhesion between the substrate and the mold therefore improved.

The devoid portions can include a notch-like shape formed on the periphery of the substrate or a through-hole formed on the inner surface of the substrate or a combination thereof. With these devoid portions, adhesion of the substrate to an epoxy resin mold package is stronger and the probability of failure from cracking or peeling off is remarkably reduced.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

In order to solve the above-discussed and other problems which are experienced with hybrid integrated circuit packages, it has been proposed, in the U.S. patent application Ser. No. 375,708, filed Jul. 5, 1989 to Toshio Matsuzaki and Hiroaki Toshima, to provide lead frame having a large opening in a support plate of the lead frame. In the above application, a circuit substrate is supported on a small remaining area of the support plate and a large portion of the bottom surface of the circuit substrate is exposed and fixed to the resin mold package. In the above application, the circuit substrate has a surface area greater than 60% of a principal surface area of the resin mold package. Also, greater than 50% and preferably 90% of the surface area of a bottom surface of the substrate is exposed to the mold package. A number of different support plate shapes are disclosed therein. These shapes include a square outline having a square opening therein, four square stages formed at each corner of an assumed square shape, and four square stages having connecting bars between adjacent stages.

Figure 1A:
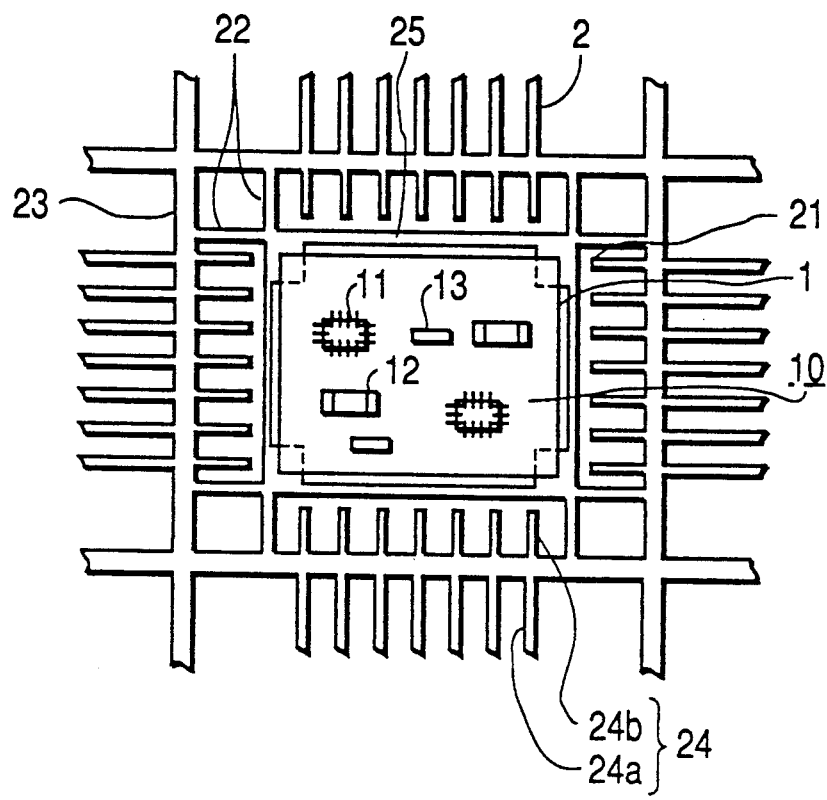
FIG. 1(a) is a plan view of a hybrid integrated circuit without a resin mold package.
Figure 1B:
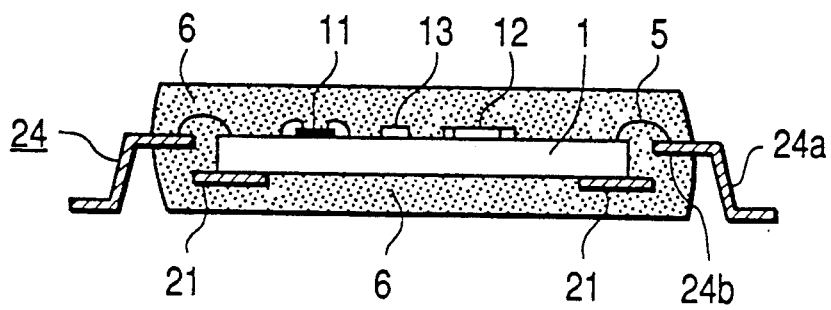
FIG. 1(b) is a schematic cross section of the hybrid integrated circuit of FIG. 1(a) with a resin mold package where four stages support a substrate and most of the bottom surface of a substrate is exposed to the mold.

FIGS. 1(a) and 1(b) show a structure of the hybrid integrated circuit disclosed in the above application, wherein FIG. 1(a) is a top view without a mold package, and FIG. 1(b) is a cross section thereof with the mold package. A lead frame 2 comprises an outer lead 24a, an inner lead 24b, a tie-bar 23, a support-bar 22, a stage 21 and a connecting-bar 25. Four stages 21 are formed at each of four corners connected by connecting-bars 25 and supported by two support-bars 22 at each of the four corners of its square shape. A square-shaped ceramic substrate 1 is supported on the four stages 21 of the lead frame 2, replacing the square support plate of the prior art. Most of the bottom surface of the ceramic substrate 1 is exposed to the mold package.

A semiconductor integrated circuit chip 11, a capacitor 12, and a resistor 13 are disposed and fixed on the ceramic substrate 1 forming a circuit substrate 10. These active and passive elements are connected to each other and to a bonding pad by a bonding wires, or to a conductive wiring pattern formed on the substrate 1. The bonding wires and wiring pattern are not shown in FIG. 1(a). The bonding pads are further connected to the terminals of the inner leads 24b by a bonding wire 5 as shown in FIG. 1(b). Thereafter, the assembly is subjected to a transfer-mold process to form a mold package 6 shown in FIG. 1(b). The outer leads 24a are then shaped and the unnecessary portions of the lead frame 2 are cut off to complete the hybrid integrated circuit.

The mold package disclosed in FIGS. 1(a) and 1b) exhibits remarkable improvements over previous structures. However, the package structure as described above absorbs moisture within the resin mold package during storage after fabrication. When it is installed on a printed circuit board by a soldering process and thereafter subjected to repeated heat cycles during operation, the mold material releases gas of the absorbed moisture. Also, as the gas expands within the package other defects arise.

Figure 2A:
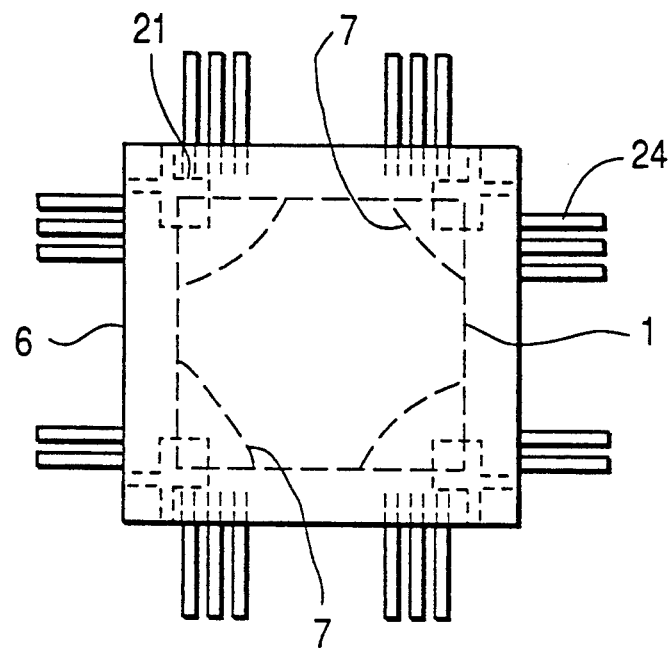
FIG. 2(a) illustrates failure patterns of the resin mold package of FIGS. 1(a) and 1(b) in which a dashed curve shows a peeling-off portion of the resin mold package which originates in the stage at the corner.
Figure 2B:
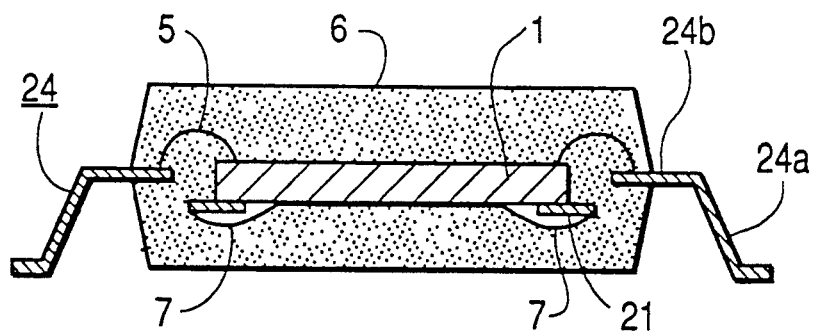
FIG. 2(b) is a schematic cross section of the failed device shown in FIG. 2(a)
Figure 2C:
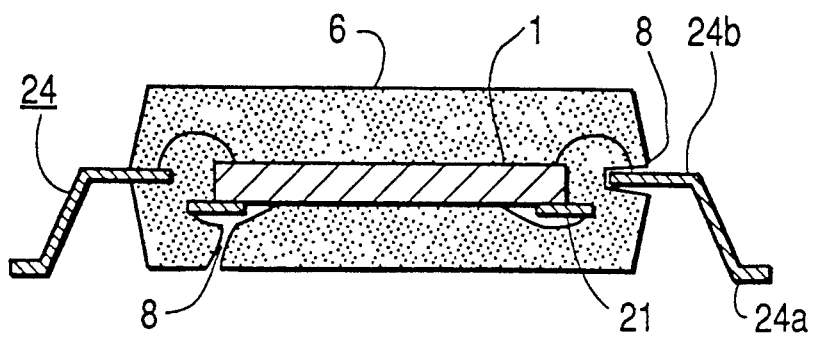
FIG. 2(c) is a schematic cross section of a failed device when the failure develops into a crack.

FIGS. 2(a), 2(b) and 2(c) illustrate an example of failure states for a mold package. FIG. 2(a) illustrates a schematic top view of the failure patterns in which the package uses a lead frame having four stages 21 and connecting-bars between stages are not used. A ceramic substrate 1 having a square shape (outline thereof is shown by dashed lines and active and passive elements thereon are omitted) is supported on the four stages 21. FIG. 2(b) is a schematic cross section of the package structure of FIG. 2(a). FIGS. 2(a) and 2(b) show an early stage of a failure pattern.

The failure states illustrated in FIGS. 2(a) and 2(b) were detected by conventional non-destructive testing using an ultrasonic reflectscope after subjecting the mold packages to thermal stressing. Using an ultrasonic reflectscope, mold packages having failures to be detected were immersed in water and subjected to ultrasonic irradiation wherein reflected ultrasonic waves were received by a sensor. The entire surface of the mold package was scanned in 50 micron increments taking about 5 minutes to scan the entire surface of the mold package. The detected data was image-processed and displayed on a screen.

The dashed curves in FIG. 2(a) show a peeling off portion 7 in which the mold 6 is slightly separated from the stage 21. As failure of the integrated circuit progresses, the peeling off failure develops into a crack failure 8, which is shown in FIG. 2(c). One crack appears on the bottom surface of the mold 6 and another between the inner lead 24b and the mold. The peeling off defects, which originate from the four stages 21 supporting the substrate 1, cannot be detected by a visual inspection at an early stage of the failure.

Figure 3A:
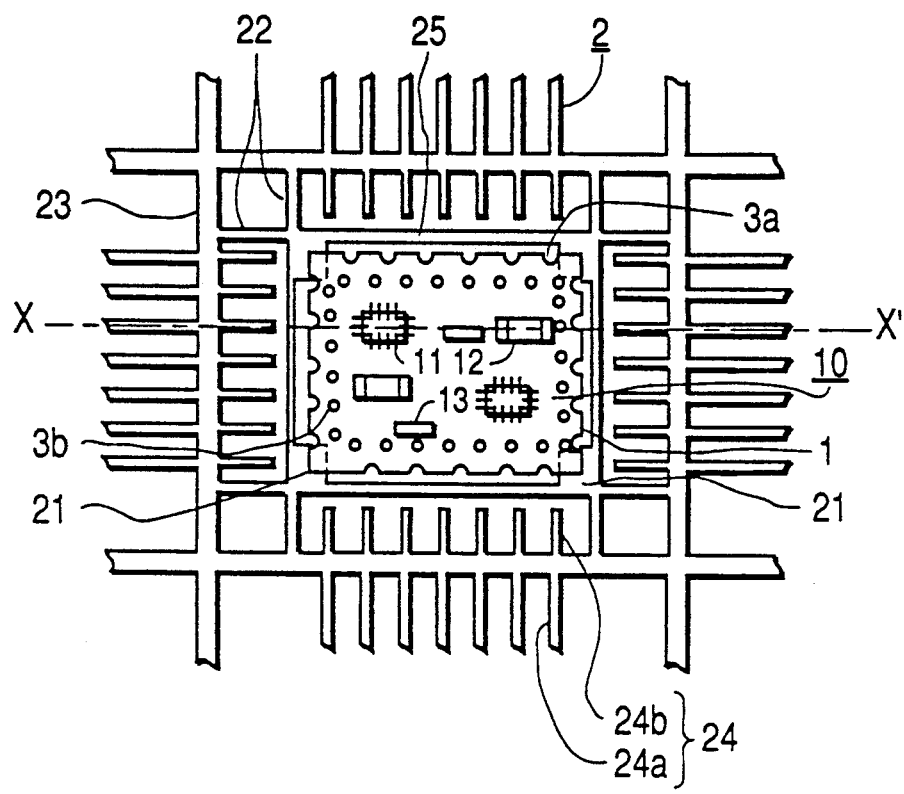
FIG. 3(a) is a plan view of an embodiment of a hybrid integrated circuit without a resin mold package.
Figure 3B:
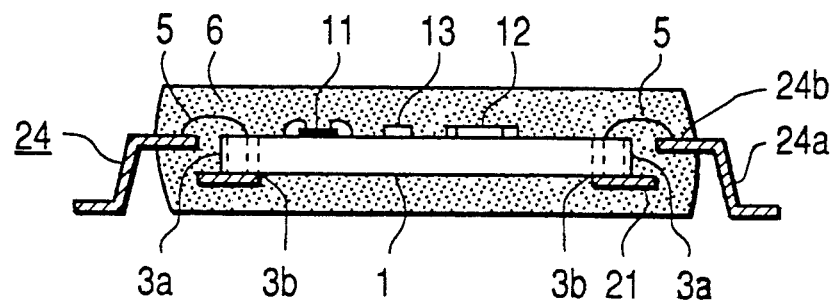
FIG. 3(b) is a schematic cross section of the device shown in FIG. 3(a) after encapsulation by a resin mold package.

FIG. 3(a) is a plan view of a hybrid integrated circuit in accordance with an embodiment of the present invention without a mold package. FIG. 3(b) is a schematic cross section of the device shown in FIG. 3(a) after mold packaging.

A lead frame 2 has the similar structure as that explained in FIG. 1(a), wherein four stages 21 are formed at each corner of a square. The four stages 21 are connected by four connecting-bars 25. Each stage 21 supported by two support-bars 22 connecting to one of adjacently arranged tie-bars 23. In the lead frame 2 of the embodiment, a support plate for supporting a substrate 1 includes of four stages 21. Each stage 21 has a small area. Therefore, most of the bottom surface of the substrate 1 is exposed through an opening in the center of the support plate between the four stages 21. The opening provides for contact of the substrate 1 with the mold. A plurality of leads 24 are provided in the lead frame 2, each lead having an outer lead 24a and an inner lead 24b.

FIG. 3(a) illustrates a circuit substrate 10 comprising the substrate 1, a semiconductor integrated circuit chip 11 as an active element, and a capacitor 12 and a resistor 13 as passive elements. These active and passive elements are disposed on and fixed to the substrate 1. Electrical connections between a terminal of these elements and a printed circuit pattern (not shown) on the substrate 1 are made by a bonding wire 5 or by direct soldering. The circuit substrate 10 is disposed on four stages 21 of the lead frame 2. Each terminal of the inner lead 24b is connected to a bonding pad (not shown) on the substrate 1 by a bonding wire 5.

In this embodiment, the substrate 1 is made of ceramic and has a thickness of 0.6 mm and a surface area of 23×23 mm. On each side of the square shape of the substrate 1, a plurality of devoid portions 3a are formed at regular intervals of 1.6 mm between adjacent devoid portions, each having a shape of a semicircle of 0.4 mm in diameter. The length of the intervals can vary from the 1.6 mm in this embodiment. The shape of all or some of the devoid portion can be semicircular, elliptical, V-shaped, U-shaped or the like. Notch-like devoid portions 3a, as illustrated, are formed on the periphery of the ceramic substrate 1 and can be any of the above-mentioned shapes. The notch-like devoid portions formed on the periphery result in elongation of the actual length of the periphery (edge) contacting with the mold package and result in increased strength after packing of the adhesion force between the substrate 1 and the mold 6.

As shown in FIG. 3(a), the substrate 1 of the embodiment further includes a plurality of devoid portions 3b of a through-hole type. These through-holes have a diameter of 0.2 mm and are spaced a regular intervals of 1.6 mm arranged along a line spaced 2 mm from each side of the square.

In the above embodiment, both the lead frame 2 and the entire circuit substrate 10 are encapsulated by a transfer-mold process using a thermosetting resin such as an epoxy resin. After molding, the outer leads 24a are shaped and unnecessary portions cut off, thereby completing fabrication of a hybrid integrated circuit of a PQFP (Plastic Quad-Flat Package) type having outside dimensions of 28×28×4 mm.

FIG. 3(b) is a schematic cross section of the hybrid integrated circuit after mold packaging taken along a line X—X'. Though the stages 21 are not positioned on the line X—X', the stage 21 is illustrated in FIG. 3(b) for easy understanding, and it is clear that the stage 21 is lowered from the level of the inner lead 24b.

To summarize the above embodiment, the devoid portions are formed along the periphery and along a line spaced from each side of a square substrate, and four stages are utilized as a support. This embodiment of the hybrid integrated circuit will hereinafter, for convenience, be designated test piece group 1.

Figure 4:
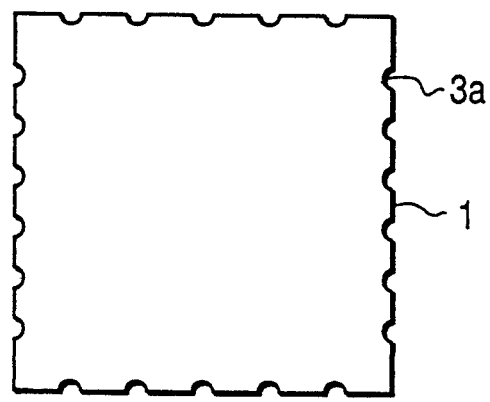
FIG. 4 is a top view of a substrate according to another embodiment of the present invention in which a plurality of devoid portions are formed only on the periphery of the substrate.

Another embodiment of the present invention utilizes a different substrate as shown in FIG. 4 within the structure of FIGS. 3(a) and 3(b). The substrate illustrated in FIG. 4 has a plurality of devoid portions 3a only along the periphery of the substrate and has no through-holes as shown in FIG. 3(a). In FIG. 4, the number of devoid portions 3a, their size and their arrangement are the same as that of the FIG. 3(a) embodiment. That is, the devoid portions have a semicircular shape with a diameter of 0.4 mm and are formed at regular intervals of 1.6 mm. This hybrid integrated circuit embodiment will be designated test piece group 2.

Figure 5:
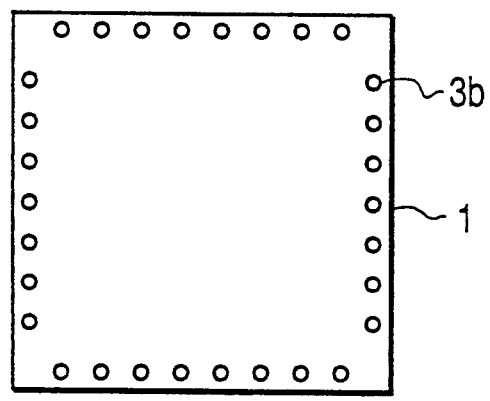
FIG. 5 is a top view of a substrate according to still another embodiment of the present invention in which a plurality of devoid portions (through-holes) are formed only near the periphery of the substrate.

Still another embodiment of the present invention utilizes the substrate shown in FIG. 5. The substrate 1 of this type has a plurality of devoid portions 3b that comprise through-holes. As shown in FIG. 5, these are no devoid portions along the periphery of the substrate 1. The number of through-holes 3b, their size and their arrangement are the same as those of FIG. 3(a). Each through-hole have a diameter of 0.2 mm, and the through-holes are formed at regular intervals of 1.6 mm along a line spaced 2 mm from each side of the substrate. This hybrid integrated circuit embodiment will be designated test piece group 3.

Figure 6:
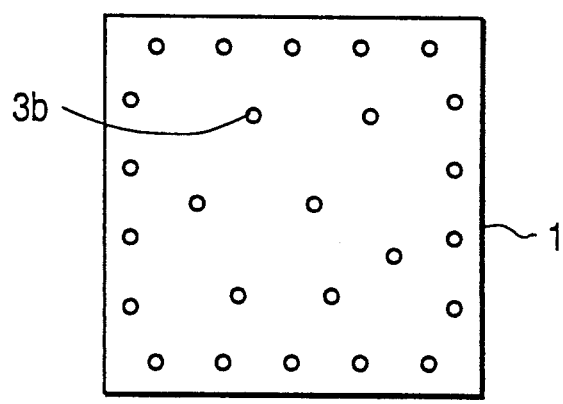
FIG. 6 is a top view of the substrate according to a further embodiment of the present invention in which a plurality of devoid portions (through-holes) are distributed on the entire surface of the substrate.
Figure 7A:
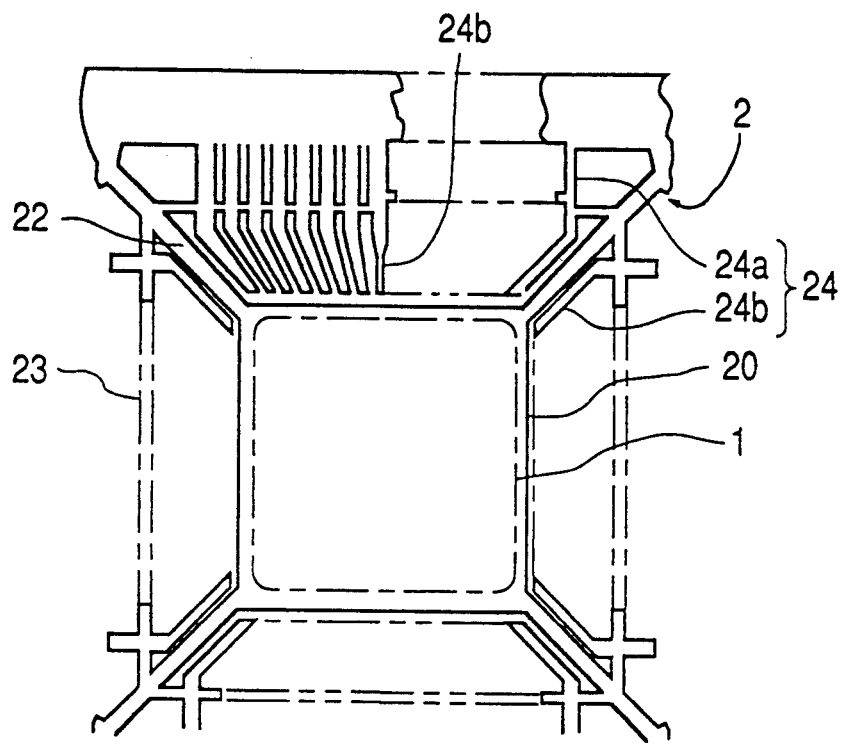
FIGS. 7(a) and 7(b) are a plan view and a schematic cross section, respectively, of a hybrid integrated circuit of the prior art, in which a square support plate is used for supporting a substrate, no resin mold package is shown in FIG. 7(a) and a crack failure in the resin mold package is shown in FIG. 7(b).
Figure 7B:
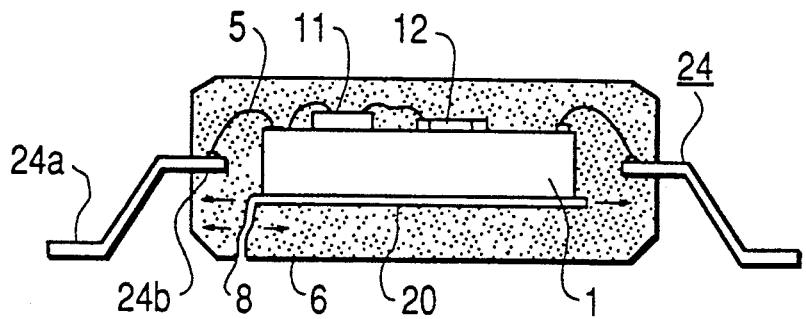

A further embodiment of the present invention utilizes the substrate shown in FIG. 6. The substrate 1 of this type has a plurality of devoid portions 3b comprising through-holes as shown in FIG. 6, there are no devoid portions along the periphery of the substrate 1. The through-holes 3b are arranged on the substrate 1 such that the through-holes do not obstruct the mounting of the active and passive elements and are not disposed on printed circuit patterns on the substrate 1. In this embodiment, each through-hole 3b has a diameter of 0.2 mm and total of 150 through-holes 3b as formed as above with an appropriate interval therebetween. This hybrid integrated circuit embodiment will be designated test piece group 4.

Besides the above four groups of test pieces, an additional group of test pieces was provided for comparison purposes and will be designated the comparison group. In the comparison group, the substrate has no devoid portions on the periphery or on the inner surface of the substrate 1.

For testing, first, each group of the test pieces was subjected to an ambient temperature of 85° and a humidity of 85% and stored separated in sub-groups, for 24, 48, 96 and 192 hours respectively. Second, the test pieces were subjected to a heat shock from either reflow or dip soldering. Reflow soldering is a soldering is a method in which test pieces are dipped in spouting hot solder. A maximum soldering temperature of 260° C. is set for both methods. Therefore, for each of the test piece groups 1 to 4 and the comparison group, eight sub-groups of test pieces were prepared and subjected to eight different test conditions. Thereafter, all test pieces were inspected by the above-explained ultrasonic reflectscope. The test results are shown in Table 1.

As expected, the dip soldering method was generally more severe than the reflow soldering method. As for the comparison group using the substrate without devoid portions, the test results show a high percentage of package failures. Only the test pieces stored for 24 hours were safe for both soldering methods.

TABLE 1

| Soldering Method | Storage Condition | Test Piece Group Number | | | | Comp. Group |
|---|---|---|---|---|---|---|
| | | 1 | 2 | 3 | 4 | |
| Reflow Soldering by Infrared Rays | 85° C.-85%-24H | ○ | ○ | ○ | ○ | ○ |
| | 85° C.-85%-48H | ○ | ○ | ○ | ○ | ○ |
| | 85° C.-85%-96H | ○ | ○ | ○ | ○ | ▲ |
| | 85° C.-85%-192H | ○ | ▲ | ○ | ○ | ▲ |
| Dip-Soldering | 85° C.-85%-24H | ○ | ○ | ○ | ○ | ○ |
| | 85° C.-85%-48H | ○ | ○ | ○ | ○ | ▲ |
| | 85° C.-85%-96H | ○ | ▲ | ○ | ○ | ● |

TABLE 1-continued

| Soldering Method | Storage Condition | Test Piece Group Number | | | | Comp. Group |
|---|---|---|---|---|---|---|
| | | 1 | 2 | 3 | 4 | |
| | 85° C.-85%-192H | ○ | ● | ▲ | ○ | ● |

○: No defect.
▲: Some of test pieces in the sub-group show peeling-off defect.
●: All test pieces show peeling-off defect or crack defect.

On the other hand, in accordance with the present invention, test piece groups 1 and 4 proved to be completely safe for both soldering tests under any of the storage conditions without failures. Furthermore, groups 2 and 3 also showed remarkable improvement in the package strength compared with the comparison group having a structure without the devoid portions.

In the explanations of the above embodiments, all active and passive elements are disposed on the front surface of the substrate 1. However, the elements may be disposed on the bottom surface of the substrate 1. In this case, a through-hole for connecting two points positioned respectively on the front and bottom surfaces of the substrate is necessary. The devoid portions 3a or 3b of the present invention can be utilized for this purpose.

In the embodiments, devoid portions are illustrated having a semicircular shape on the periphery of the substrate 1 and a circular shape on the inner surface thereof. However, any shape can be used for the devoid portion of the present invention. The arrangement of these devoid portions on the surface and the interval between adjacent two devoid portions do not need to be uniform but can be arbitrary.

The present invention may be used for constructing a large scale semiconductor integrated circuit in which a ceramic substrate is not used. Instead, a semiconductor substrate of a large size is directly disposed on the stages of a lead frame and a plurality of devoid portions are formed in the semiconductor substrate.

The present invention may be used still further in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

I claim:

1. A hybrid integrated circuit comprising:
   a lead frame including a plurality of leads and a support plate;
   a substrate having a plurality of devoid portions formed therein and mounted on said support plate;
   at least one active element and/or passive element disposed on said substrate; and
   a resin mold encapsulating said substrate, said support plate, said active element and/or passive element and a portion of said leads, said resin mold filling said plurality of devoid portions of said substrate.

2. A hybrid integrated circuit as recited in claim 1, wherein said support plate has an opening formed therein exposing most of a bottom surface of said substrate to said resin mold.

3. A hybrid integrated circuit as recited in claim 1, wherein said devoid portions comprise notches formed along a periphery of said substrate.

4. A hybrid integrated circuit as recited in claim 3, wherein each of said notches are selected from any one of a semicircular shape, a V-shape and a U-shape.

5. A hybrid integrated circuit as recited in claim 1, wherein each of said devoid portions comprises a through-hole.

6. A hybrid integrated circuit as recited in claim 3, wherein said devoid portions further comprise a plurality of through-holes.

7. A hybrid integrated circuit as recited in claim 3, wherein said devoid portions are formed in said substrate at regular intervals along the periphery.

8. A hybrid integrated circuit as recited in claim 5,
   wherein said substrate has a rectangular or square shape; and
   wherein said through-holes are formed along lines parallel with respective sides of said substrate.

9. A hybrid integrated circuit as recited in claim 5, wherein said through-holes are formed in said substrate beside said active and passive elements.

10. A hybrid integrated circuit as recited in claim 2, wherein said support plate comprises four stages arranged at each of four corners in a rectangular shape, said substrate supportingly mounted on said four stages.

11. An integrated circuit comprising:
    a lead frame;
    a substrate supportingly disposed on said lead frame, said substrate including a plurality of devoid portions; and
    a resin mold encapsulating said substrate and at least a portion of said lead frame, said resin mold filling said plurality of devoid portions.

12. An integrated circuit according to claim 11,
    wherein said lead frame includes a plurality of leads and a support plate; and
    wherein said substrate is supportingly disposed on said support plate.

13. An integrated circuit according to claim 12,
    wherein said support plate has an opening formed therein exposing most of a bottom surface of said substrate to said resin mold; and
    wherein said substrate is in thermal communication with said resin mold through said opening.

14. An integrated circuit according to claim 13, wherein said opening has a size such that substantially all of a bottom surface of said substrate is in thermal communication with said resin mold.

15. An integrated circuit as recited in claim 11, wherein said devoid portions comprise notches formed along a periphery of said substrate.

16. An integrated circuit as recited in claim 15, wherein each of said notches are selected from any one of a semicircular shape, an elliptical shape, a V-shape and a U-shape.

17. An integrated circuit as recited in claim 15, wherein said devoid portions further comprise a plurality of through-holes.

18. An hybrid integrated circuit as recited in claim 15, wherein said devoid portions are formed in said substrate at regular intervals along the periphery.

19. An integrated circuit as recited in claim 11, wherein each of said devoid portions comprises a through-hole.

20. An integrated circuit as recited in claim 19,
    wherein said substrate has a rectangular shape; and
    wherein said through-holes are formed along lines parallel with respective sides of said substrate.

21. An integrated circuit as recited in claim 11, wherein said substrate comprises a ceramic substrate.

22. A hybrid integrated circuit as recited in claim 1, wherein said resin mold consists of an epoxy resin material.

23. An integrated circuit as recited in claim 11, wherein said resin mold consists of an epoxy resin material.

* * * * *